United States Patent [19]

Taber

[11] Patent Number: 4,809,156

[45] Date of Patent: Feb. 28, 1989

[54] ADDRESS GENERATOR CIRCUIT

[75] Inventor: John E. Taber, Rolling Hills Estates, Calif.

[73] Assignee: TRW Inc., Redondo Beach, Calif.

[21] Appl. No.: 51,173

[22] Filed: May 13, 1987

Related U.S. Application Data

[63] Continuation of Ser. No. 591,071, Mar. 19, 1984, abandoned.

[51] Int. Cl.⁴ .............................. G06F 7/00; G06F 9/00
[52] U.S. Cl. ..................................... 364/200; 364/900
[58] Field of Search ................................ 364/200, 900

[56] References Cited

U.S. PATENT DOCUMENTS

| | | | |
|---|---|---|---|
| 3,946,366 | 3/1976 | Edwards, Jr. ..................... | 364/200 |
| 4,121,286 | 10/1978 | Venton et al. ..................... | 364/200 |
| 4,206,503 | 6/1980 | Woods et al. ..................... | 364/200 |
| 4,240,139 | 12/1980 | Fukuda et al. ..................... | 364/200 |
| 4,306,287 | 12/1981 | Huang ..................... | 364/200 |
| 4,339,796 | 7/1982 | Brereton et al. ..................... | 364/200 |
| 4,432,053 | 2/1984 | Gaither et al. ..................... | 364/200 |
| 4,450,525 | 5/1984 | Demuth et al. ..................... | 364/200 |
| 4,459,661 | 7/1984 | Kaneda et al. ..................... | 364/200 |
| 4,575,814 | 3/1986 | Brooks, Jr. et al. ................ | 364/900 |

Primary Examiner—Gareth D. Shaw
Assistant Examiner—Christina M. Eaknian
Attorney, Agent, or Firm—Noel F. Heal; Robert W. Keller

[57] ABSTRACT

A circuit for generating memory addresses for use in a computer system. The circuit includes multiple address register files that are usable to store parameters of multiple addressing sequences. Each address register file includes a base register for storing a base memory address, an accumulator register for storing a current address in the sequence, a displacement register for storing an address displacement to be used in conjunction with the accumulator register to produce the address sequence, an extension register used as an alternative displacement register, a count accumulator register to monitor a count of the address items in the sequence, and a count restore register used to store an original count for use at the end of the sequence. The circuit is responsive to a variety of commands to load and read the registers, and to manipulate them to provide a desired address sequence, which may be a modulo-N sequence useful in a variety of applications, such as accessing a matrix column-by-column when it is stored row-by-row.

23 Claims, 1 Drawing Sheet

ADDRESS GENERATOR CIRCUIT

This application is a continuation, of application Ser. No. 591,071, filed Mar. 19, 1984, now abandoned.

BACKGROUND OF THE INVENTION

This invention relates generally to digital computers, and more particularly, to the generation of memory addresses for use by computers. A typical computer system includes a central processor and at least one random access memory module. In general, the central processor has access to both a program memory, in which programs of instructions are stored, and a data memory in which data required for operation of the programs are stored. Of course, the computer system will have other components as well, such as input and output devices.

In the processing of data, a computer system must frequently and repeatedly compute data memory addresses for the storage and retrieval of the data. A typical sequence of operations may call for the sequential retrieval of a set of data stored in consecutive addresses in the data memory. A common technique for handling this in a general-purpose computer is to employ "indexed" addressing, whereby the address from which a stored item is to be retrieved is computed by adding a base address to a number stored in an index register. The index register is then incremented or decremented after each retrieval step in the sequence. Thus, for example, if the first address to be accessed is A, the base address, which can be part of a retrieval or "load" instruction, would also be A, and the index register can be set initially to zero. After the first access to memory, the index is incremented to "1" and the next access would be to address A+1, and so forth. The program of instructions for this sequence must include an instruction to increment the index register after each retrieval, and another to test the value of the index register to determine if the end of the sequence has been reached.

Since a test for a non-zero value of the index register may be cumbersome, the program may instead be designed to store in the index register an initial a count of items to be accessed, and then to decrement the index register during each cycle, testing for a zero value to determine the end of the sequence.

In any event, it will be appreciated from this simple example that the central processor must execute a number of instructions of a "house-keeping" nature to compute the appropriate memory addresses for a particular data-processing problem. For relatively complex data-processing problems, in which the data may consist not of simple one-dimensional arrays, but may instead take the form of multi-dimensional arrays or unusual configurations of data, the central processor may spend a substantial proportion of its available time merely in computing memory addresses.

This problem is further compounded if the central processor is called upon to manipulate, at about the same time, several different sets of data having different organizations. Indexes and pointers relating to one set of data may have to be temporarily saved while the indexes and pointers relating to another set of data are being employed. The computational overhead that these manipulations impose on the computer system become increasingly significant as the complexity of the computer applications increases. A related difficulty is that the complexity of the programming task also increases, so that the cost of the resulting software is significantly higher.

It will be appreciated from the foregoing that there is a need for an alternative to the generation of memory addresses by the central processor. The present invention fulfills this need.

SUMMARY OF THE INVENTION

The present invention resides in a circuit for the generation of memory addresses for use by a computer system. Basically, and in general terms, the address generator circuit of the invention includes a plurality of address generation files, each of which defines a specific address generation problem, and address generation logic coupled for selective access to the address generation files and coupled to receive instructions from the central processor and to provide address and file data to the central processor.

More specifically, each of the address generation files includes a base register for storing a base memory address, a displacement register for storing a memory address displacement, and an accumulator register for storing a current memory address computed by repeated computations of the memory address from the base address and the displacement address. Each file also includes a count accumulator register, for storing a count of the number of items accessed.

One of the most important aspects of the invention is that the address generator logic includes means for selecting a desired one of the address generation files for generation of a desired address, or sequence of addresses. Moreover, the generation of a sequence of addresses may be interrupted as desired, to provide the generation of one or more addresses based on a different file of address generation registers, and later continued with the original file registers kept intact.

Another important feature of the invention is that the contents of the registers of a particular address generation file may be combined in a variety of ways to generate addresses, under the control of instructions transmitted from the central processor. The two fundamental instructions that control operation of the address generator logic are a "first" instruction and a "next" instruction. The "first" instruction in one typical mode of operation obtains the contents of the base register as an output to the central processor. However, there a number of variants of the "first" instruction that have different effects on the output memory address and on the accumulator register. One basic type of "first" instruction uses the file currently being accessed, while another basic type allows the file to be selected by providing a new value for a file pointer contained in the address generator logic.

The "next" instruction yields the next address in a desired sequence of addresses initiated by a corresponding "first" instruction. In the normal addressing sequence, the "first" instruction yields the base address and also stores it in the accumulator register. Then each "next" instruction adds the displacement register to the accumulator register, outputs the resulting address, and also stores it back in the accumulator register. Simultaneously, the count accumulator register is decremented and tested for zero. Other variations of the fundamental instructions provide for the use of address displacements of +1 or −1 instead of the contents of the displacement register.

Another register, referred as the count restore register, may be used to restore an initial count value in the count accumulator register. In all of the address generation instructions, there are basically two alternatives at the termination of an addressing sequence. Either the original count is restored and the sequence begins over again at the base address, or decrementing of the count is ended and there are no further displacements added to the address in the accumulator register. In the latter alternative, the address generator yields the last address of the sequence repeatedly if additional "next" instructions are executed.

Values may be stored in the various registers by means of file-loading instructions transmitted from the central processor. In accordance with another aspect of the invention, the file data may be transmitted to the address generator logic in an "immediate" mode, in which the data accompanies the central processor instructions and is stored in the program memory of the processor. Alternatively, there is an "indirect" mode, in which the data to be loaded is obtained from the data memory of the central processor. In one special case of data input, an address may be transmitted directly from the input to the address output of the address generator logic.

Another important aspect of the invention is that the address generator files each include an extension register, which may be used as an alternative to the displacement register. There are some computational applications of computers that require the use of a first address displacement in some situations and a second displacement in others. The extension register fulfills this requirement, and the address generator logic includes means for selecting automatically from the two available displacements.

In structural terms, the address generator logic includes a file pointer for selecting a particular file of address generation registers, an adder for generating a memory address for output and for storage in the selected accumulator register, a set of input registers for inputting data to the address generation files, a memory address output register, and a file data register for reading information from the address generation files. The remaining structure includes a number of controlled mutiplexers (MUX's) for selecting input data for various registers and logical elements in the logic. One MUX is employed to select either the accumulator or the base register, to provide a first adder input, and another MUX selects as the second adder input either the displacement register, the extension register, the input data register, or selected numerical quantities of "−1", "+1" or "0". Another multiplexer is used to select which of the registers is to be output through the file data output register. Still other multiplexers are used to control data input to the file registers and decrementing of the count accumulator. All of the multiplexers and data file registers are controlled by signals derived from an instruction decoder in the address generator logic.

It will be appreciated from the foregoing that the present invention represents a significant advance over address generation techniques of the prior art. Although all of the address generation functions might be obtained in a conventional computer system using a central processor for these purposes, complex address generation functions would then be performed only at the expense of reduced processing speed and at a greater programming cost. The present invention provides a wide variety of address generation features without burdening the central processor unnecessarily with these chores, and relieves the programmer of much of the complexity of address generation. Although the circuit of the invention could be implemented in a variety of forms, it lends itself to implementation as a separate integrated-circuit chip, for use in conjunction with a central processor chip for performing the necessary arithmetic and logical functions of a program. Other aspects and advantages of the present invention will become apparent from the following more detailed description, taken in conjunction with the accompanying drawings.

DESCRIPTION OF THE PREFERRED EMBODIMENT

As shown in the drawings for purposes of illustration, the present invention is concerned with the generation of memory addresses for use in a computer system. In a conventional computer system, a central processor not only performs arithmetic and logical computations, but also has to determine memory addresses prior to or as part of each storage or retrieval instruction that is executed. This effectively slows down the central processor, and increases the complexity and cost of programs written for the computer system.

In accordance with the invention, a separate address generation circuit is employed to compute memory addresses under the control of instructions from the central processor. Probably the most important aspect of the invention is that the address generator circuit has multiple address generation files that allow it to keep track of multiple address generation requirements simultaneously. The central processor may then address multiple sets of data stored in accordance with different data organizations. This may be needed for use in a single program running in the central processor, or it may arise from the execution of several programs on a time-shared basis.

Figures 1, 2:
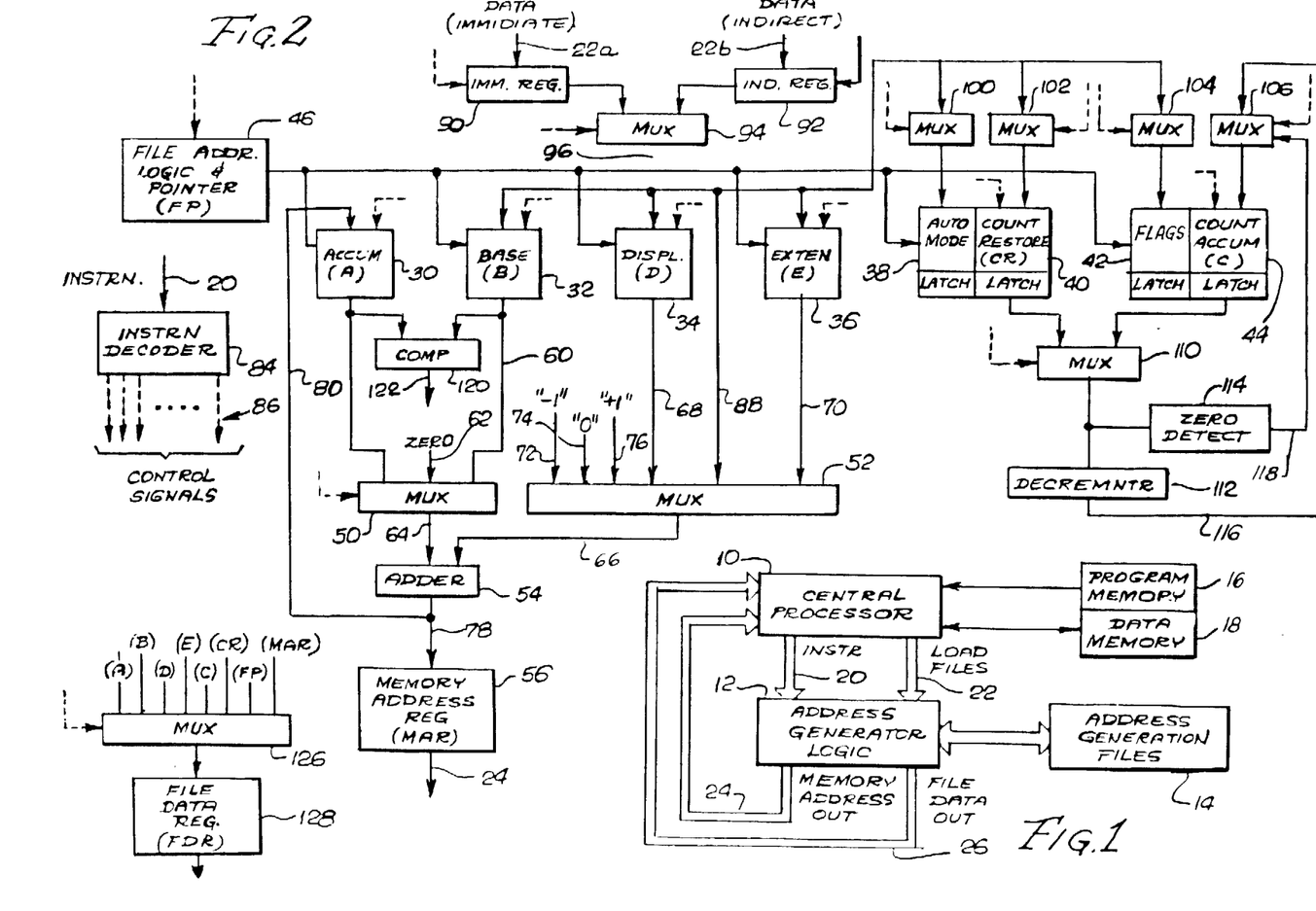
FIG. 1 is a simplified block diagram showing the relationship between a computer system and the address generator circuit of the present invention.
FIG. 2 is a block diagram of the address generator circuit of the present invention.

FIG. 1 shows the relationship between the central processor, indicated by reference numeral 10, and the circuit of the invention, which includes address generator logic 12 and address generation files 14. The central processor 10 has associated with it a program memory 16 and a data memory 18, which may in fact be included within a single memory module. Programs of instruction are stored in the program memory 16, and will typically call for data storage in and retrieval from the data memory 18. The principal function performed by the circuit of the invention is to generate data memory addresses for use by the central processor 10 in fetching data from the data memory 18, but without burdening the central processor with the task of generating data memory addresses.

The central processor 10 controls the address generator logic 12 by means of instructions transmitted over a path indicated at 20, and loads the address generation files over another path, indicated at 22. In response to the instructions received from the central processor 10, the address generator logic 12 generates memory addresses for transmission over line 24 back to the central processor, and satisfies requests for data from the address generation files by transmitting such data over line 26 to the central processor. It will be understood that these data paths are multi-bit paths capable of transmitting, for example, 16-bit items of data.

The address generation files 14 (FIG. 1) each include, as shown in FIG. 2, a set of separate registers, specifically an accumulator register 30, a base register 32, a displacement register 34, an extension register 36, an auto-mode register and latch 38, a count restore register and latch 40, a flag register and latch 42, and a count accumulator and latch 44. Each of these registers is in reality a multiplicity of registers, there being one set of registers corresponding to each of the address generation files. Stated another way, each address generation file comprises a unique accumulator register, base register, and so forth. File address logic 46, which includes a file address pointer, determines which address generation file is to be used for a particular address generation step. The file address logic 46 generates on output lines 48 a file address, which is used to control addressing in each of the registers 30–44. The file pointer in the logic 46 thereby determines which address generation file is to be used for a particular instruction.

The address generator logic 12 also includes two multiplexers 50 and 52, an adder 54, and a memory address register 56 for output of memory addresses over line 24 to the central processor 10. Multiplexer 50 receives as selectable inputs the contents of the accumulator register 30 and the contents of the base register 32, over lines 58 and 60, respectively, and a zero input indicated at 62. The output of this multiplexer 50, on line 64, is supplied as one input to the adder 54. The other input to the adder 54 is provided over line 66 from the other multiplexer 52. The alternative inputs to this multiplexer are derived from the displacement register 34, over line 68, from the extension register 36, over line 70, and from fixed-number inputs of −1, 0 and +1, as indicated at 72, 74 and 76, respectively. The output of the adder 54 is transmitted to the memory address register 56, over line 78, and back to the accumulator as an input, over line 80.

The foregoing description should permit an understanding of at least the basic functions of the address generator logic in a normal mode of operation. The base register 32 is initially loaded with a starting address of a set of data to be accessed in the computer data memory 18 (FIG. 1), and the displacement register is used to store a desired address displacement between locations to be accessed. Alternatively, as is often the case, a fixed displacement of +1 or −1 may be used by appropriate selection of one of these quantities in the multiplexer 52.

When a "first" instruction is received over line 20 from the central processor 10, it is first decoded in an instruction decoder 84, which generates in response to the instruction a unique combination of control signals, indicated at 86. These control signals are distributed to the various multiplexers and registers in the logic and effect the selected instruction. In the case of a "first" instruction, the base-register input to multiplexer 50 is selected, and the "zero" input to multiplexer 52 is selected. Accordingly, the adder 54 generates as its output the contents of the base register 32. This output is transmitted both to the memory address register 56 and to the accumulator register 30. When a subsequent "next" instruction is received over line 20 control signals are generated to select as adder inputs the contents of the accumulator register and the contents of the displacement register. The sum of these registers is output as the required address in the memory address register 56, and is again recirculated to the accumulator register. The effect of this and subsequent "next" instructions is to generate a sequence of addresses of the type B, B+D, B+2D, and so forth, where B is the contents of the base register 32 and D is the contents of the displacement register 34.

Many different variations of the "first" and "next" instructions are possible. For example, a displacement of +1 or −1 may be used without preloading the displacement register 34 with these quantities. Also, the contents of the extension register 36 may be used as an alternative to the displacement register 34. This feature will be discussed at greater length with reference to a specific example. Another possibility is that an input quantity derived from input lines 22 may be transmitted over line 88 to the multiplexer 52, and thence to the adder 54, where it may be either modified or not by the other input to the adder. A more specific possibility is the transmission of an input address directly to the memory address register 56.

Input to the registers 30–44 is effected through two input registers 90 and 92 and an input multiplexer 94. The data that is input may be either "immediate," which means only that the data accompanies the central processor instruction for the input of the data. In other words, the data to be input is derived from the program memory (16) of the computer system. The other mode of data input is termed "indirect," which means that the instruction for the input of the data contains an address of the data, rather than the data itself. The two modes of data input necessitate the two separate input registers 90 and 92, each of which provides an input to an input data multiplexer 94. The multiplexer 94 provides data output on line 96, which is coupled to the file address registers 32–44. Only the accumulator register 30 is not loadable in this manner, since its contents are always fed back from the adder 54. Instructions for loading data, indicated at line 20, are decoded in the decoder 84, which generates control signals to enable writing in the registers that are to be loaded with data.

Additional multiplexers 100, 102, 104 and 106 are used to control loading of the auto-mode register 38, the count restore register 40, the flag register 42 and the count accumulator 106. In various situations, these registers may be loaded with data other than from the data input line 96, which connects as one input to each of these four multiplexers. As will be described with reference to the complete instruction set of the circuit, the auto-mode register 38 determines a particular mode of operation for some of the instructions. The flag register 42 contains three single-bit flags: a zero flag, a mode flag and a sign flag. These flags may be loaded with specific values by instructions from the central processor, and the values represent status conditions that may also be read by the central processor. More importantly, the flags are used in the multiplexers 50 and 52 to control the selection of inputs to the adder 54.

The multiplexer 104 for input of data to the flags actually comprises three separate multiplexers (not shown), one for each of the flags. The mode flag may be either loaded from one bit of the data line 96, or recycled from the previous value of the flag. The zero flag may be either loaded from one bit of the data line 96, loaded from a zero detection signal, to be described, or recycled from its previous value. Finally, the sign flag may be either loaded from one bit of the data line 96, loaded from a sign detector signal to be described, or recycled from its previous value.

Output data from the count restore register 40 and the count accumulator register 44 are input to another selection multiplexer 110. In most circumstances, the count accumulator data is selected for input to a decrementer circuit 112 and to a zero detection circuit 114. The decrementer circuit 112 reduces the count by one and passes the reduced count back over line 116 to multiplexer 106, through which it is restored to the count accumulator register 44. Upon detection of a zero count from the multiplexer 110, the zero detection circuit 114 generates a control signal on line 118. This operates as one of the control signals to multiplexer 106 and inhibits restoring of any further decremented count. The zero detection signal is also used to set the zero flag, which in turn is used in control of the multiplexers 50 and 52. In particular, the zero flag is used to take appropriate action at the end of an addressing sequence. Depending on the instruction being executed, the sequence is either stopped at the last generated address, or the base value is selected again to restart the sequence from the beginning. For the restart option, the count restore register 40 is used to restore the count accumulator 44 to its original starting point, by selecting the count restore input to multiplexer 110.

A comparator 120 receives as inputs the values stored in the accumulator and base registers 30 and 32, and generates a sign detection output signal on line 122. This sign detection signal is reflected in the value of the sign flag, and may be used to determine whether the displacement register 34 or the extension register 36 is selected for input to the adder 54. The manner in which this feature is employed will become apparent from a subsequent numerical example.

The only remaining logic to be described in FIG. 2 is yet another selection multiplexer 126, which is used in conjunction with a file data register 128, to provide output of requested information from the various file registers. For instructions to obtain "first" and "next" addresses in a sequence, the file data register 128 will either contain the same address as the memory address register 56, or the value of the current count and flag values, depending on the setting of a flip-flop (not shown).

For a better understanding of the various modes of operation that are available in the address generator circuit of the invention, it will be useful to review the complete instruction set and the corresponding function of each instruction. In the tables that follow, the letters Z, S and M stand for the zero, sign and mode flags, the letter X indicating that the value of the flag is not significant for that particular instruction. Also, the following additional abbreviations are used:

MAR=memory address register,
FDR=file data register,
FP=file pointer,
A=accumulator register,
B=base register,
D=displacement register,
E=extension register
CR=count restore register,
AM=auto-mode,
C=count accumulator register,
IMM=immediate input register, and
IND=indirect input register.

TABLE 1

BASIC INSTRUCTION SET

| CODE (HEX) | FLAGS (ZSM) | DESCRIPTION |
|---|---|---|
| 00 | XXX | No operation |
| 01 | XXX | Read file pointer, flags & auto-mode |
| 02 | XXX | Read base: FDR=B |
| 03 | XXX | Read displacement: FDR=D |
| 04 | XXX | Increment file pointer: FP=FP+1 |
| 05 | XXX | Read count restore & auto-mode: FDR=CR/AM |
| 06 | XXX | Load MAR with A plus offset: MAR=A+IMM Read count & flags: FDR= C/flags |
| 07 | XXX | Load MAR from IMM: MAR=IMM, FDR=FDR |
| 08 | — | Not used |
| 09 | XXX | Load base from IMM: B=IMM |
| 0A | — | Not used |
| 0B | XXX | Load displacement from IMM: D=IMM |
| 0C | XXX | Load FP, flags, AM from IMM; Load all files at prev. FP from IND |
| 0D | XXX | Load CR & AM from IMM |
| 0E | XXX | Load MAR with B plus offset: MAR=B+IMM; Read MAR: FDR=MAR |
| 0F | XXX | Load E from IMM: E=IMM |
| 10 | XXX | Clear file pointer: FP=0 |
| 11 | XXX | Load C & flags from IND: C/flags=IND |
| 12 | — | "First" member of file at existing file pointer (see Table 3); Read MAR or C/flags to FDR (see note #1) |
| 13 | — | "Next" member of indicated file (see Table 4); Read MAR or C/flags to FDR (see note #1) |
| 14 | XXX | Decrement file pointer: FP=FP−1 |
| 15 | XXX | Load A from IND input: A=IND |
| 16 | XXX | Load MAR with A plus offset: MAR=A+IND; Read A: FDR=A |
| 17 | XXX | Load MAR from IND: MAR=IND, FDR=FDR |
| 18 | — | Not used |
| 19 | XXX | Load base from IND: B=IND |
| 1A | — | Not used |
| 1B | XXX | Load D from IND: D=IND |
| 1C | XXX | Load FP, flags & AM from IND: FP/flags/AM=IND; Load all files at prev FP from IMM |
| 1D | XXX | Load CR & AM from IND: CR/AM=IND |
| 1E | XXX | Load MAR with B plus offset: MAR=B+IND; Read extension register: FDR=E |
| 1F | XXX | Load extension reg. from IND: E=IND |
| 2Q | XXX | Set file pointer to Q (0-3): FP=Q |
| 3Q | — | "Next" addr for FP=Q (as per Table 4); Read MAR or C/flags (see note #1) |
| 4Q | XXX | Load MAR with A plus offset Q: MAR=A+Q |
| 5Q | XXX | Load MAR with B plus offset Q: MAR=B+Q |
| 6Q | XXX | Load MAR with A at existing file pointer plus E offset at file pointer Q MAR=A+E(Q) |
| 7Q | XXX | Load MAR with B at existing file pointer plus E offset at file pointer Q: MAR=B+E(Q) |
| 8Q | XXX | "First" addr. of normal sequence with stop (see Note #3), FP=Q: MAR=B, A=B, AM=0; Read MAR or C/flags (see Note #1) |
| 9Q | XX0 | "First" addr. of ModN sequence with stop (see Note #3), FP=Q: MAR=B−E, A=B−E, AM=1 Read MAR or C/flags (see Note #1) |
| | XX1 | Same as above but MAR=B+D, A=B+D |
| AQ | XXX | "First" addr. of normal sequence with restore (see Note #3), FP=Q: MAR=B, A=B, AM=2 Read MAR or C/flags (see Note #1) |
| BQ | XX0 | "First" addr. of ModN sequence with restore (see Note #3), FP=Q: MAR=B−E, A=B−E, AM=3 Read MAR or C/flags (see Note #1) |

TABLE 1-continued
BASIC INSTRUCTION SET

| CODE (HEX) | FLAGS (ZSM) | DESCRIPTION |
|---|---|---|
| | XX1 | Same as above but MAR=B+D, A=B+D |
| CQ | XXX | "First" addr. of incrementing sequence with stop (see Note #3), FP=Q: MAR=B, A=B, AM=4 |
| DQ | XXX | "First" addr of decrementing sequence with stop (see Note #3), FP=Q: MAR=B, A=B, AM=5 |
| EQ | XXX | "First" addr of incrementing sequence with restore, (see Note #3), FP=Q: MAR=B, A=B, AM=6 |
| FQ | XXX | "First" addr of decrementing sequence with restore, (see Note #3), FP=Q: MAR=B, A=B, AM=7 |

TABLE 2
FORMATS FOR LOADS AND READS (a) Count restore and auto-mode instructions (05, 0D & 1D):
15 14 13 12 11 10 09 08 07 06 05 04 03 02 01 00
←AM→ X     ←Count Restore→

(b) Count accumulator and flags instructions (11 and all reads of C and flags):
15 14 13 12 11 10 09 08 07 06 05 04   03   02   01        00
←Count→                                X    Z    M         S (c) File pointer, flags, auto-mode instructions (01, 0C & 1C):
15 14  13 12  11  10  09 08 07 06 05 04  03  02 01 00
←AM→ D1 AF D2 X X < FP> D3 D4 Z N S where:
D1 = load disable - auto-mode
AF = load all files from othe input (IMM or IND)
D2 = load disable - file pointer
D3 = load disable - zero flag
D4 = load disable - mode flag
D5 = load disable - sign flag

TABLE 3
FIRST INSTRUCTIONS (12)

| AUTO MODE | FLAGS ZSM | DESCRIPTION |
|---|---|---|
| 0 | XXX | "First" addr. of normal sequence with stop (see Note #3), FP=FP: MAR=B, A=B; Read MAR or C/flags (see Note #1) |
| 1 | XX0 | "First" addr. of ModN sequence with stop (see Note #3), FP=FP: MAR=B−E, A=B−E; Read MAR or C/flags (see Note #1) |
| | XX1 | Same as above but MAR=B+D, A=B+D |
| 2 | XXX | "First" addr. of normal sequence with restore (see Note #3), FP=FP: MAR=B, A=B; Read MAR or C/flags (see Note #1) |
| 3 | XX0 | "First" addr.. of ModN sequence with restore (see Note #3), FP=FP: MAR=B−E, A=B−E; Read MAR or C/flags (see Note #1) |
| | XX1 | Same as above but MAR=B+D, A=B+D |
| 4 | XXX | "First" addr.. of incrementing sequence with stop (see Note #3), FP=FP: MAR=B, A=B; Read MAR or C/flags (see Note #1) |
| 5 | XXX | "First" addr of decrementing sequence with stop (see Note #3), FP=FP: MAR=B, A=B Read MAR or C/flags (see Note #1) |
| 6 | XXX | "First" addr of incrementing sequence with restore (see Note #3), FP=FP: MAR=B, A=B; Read MAR or C/flags (see Note #1) |
| | XXX | "First" addr of decrementing sequence with restore (see Note #3), FP=FP: MAR=B, A=B; Read MAR or C/flags (see Note #1) |

TABLE 4
NEXT INSTRUCTIONS (13)

| AUTO MODE | FLAGS ZSM | DESCRIPTION |
|---|---|---|
| 0 | 0XX | Normal sequence with stop: MAR=A+D. A=A+D; Read MAR or C/flags (see Note #1) |
| | 1XX | Same as above but MAR=A, A=A |
| 1 | 00X | ModN sequence with stop: MAR=A−E. A=A−E; (see Note #4) Read MAR or C/flags (see Note #1) |
| | 01X | Same as above but MAR=A+D, A=A+D |
| | 1XX | Same as above but MAR=A, A=A |
| 2 | 0XX | Normal sequence with restore: MAR=A+D, A=A+D (see Note #4) Read MAR or C/flags (see Note #1) |
| | 1XX | Same as above but MAR=B, A=B |
| 3 | 0XX | ModN sequence with restore: MAR=A−E. A=A−E (see Note #4) Read MAR or C/flags (see Note #1) |
| | 01X | Same as above but MAR=A+D, A=A+D |
| | 1XX | Same as above but MAR=B, A=B |
| 4 | 0XX | Increment with stop: MAR=A+1, A=A+1 (see Note #4) Read MAR or C/flags (see Note #1) |
| | 1XX | Same as above but MAR=A, A=A |
| 5 | 0XX | Decrement with stop: MAR=A−1, A=A−1 (see Note #4) Read MAR or C/flags (see Note #1) |
| | 1XX | Same as above but MAR=A, A=A |
| 6 | 0XX | Increment with restore: MAR=A+1, A=A+1 (see Note #4) Read MAR or C/flags (see Note #1) |
| | 1XX | Same as above but MAR=B, A=B |
| 7 | 0XX | Decrement with restore: MAR=A−1, A=A−1 (see Note #4) Read MAR or C/flags (see Note #1) |
| | 1XX | Same as above but MAR=B, A=B |

Note #1: For all "first" and "next" instructions (12, 13, 3Q and 8Q-FQ), there is an accompanying read into the file data register (FDR) of the contents of either the memory address register (MAR), or the count accumulator (C) and the flags, as determined by the state of a flip-flop.

Note #2: Although Q is generally limited by design to the integral values of 0 through 15, for this illustrative embodiment, Q is limited to the values 0, 1, 2, or 3.

Note #3: For "first" instructions, the count accumulator register is initialized to a value C=CR−1, unless CR=0, then C=0. In other words, the count restore register (minus one) is used to initialize the count accumulator register on a "first" instruction, unless the count restore register is a zero, in which case the count accumulator is initialized at zero.

Note #4: (a) For "next" instructions with "stop," or with "restore" and a zero flag of zero, the count accumulator register is decremented (C=C−1) unless already zero.
(b) For "next" instructions with "restore" and a zero flag of one, the count accumulator register is replaced with a decremented count restore register (C=CR−1), unless CR is already zero, in which case the count accumulator register C is also set to zero.

From the foregoing tables defining the instruction set of the address generator circuit, it can be appreciated that the invention provides a wide variety of address generation commands and sequences. Although the combinations of instructions are numerous, some of the more important ones will now be reviewed in more detail.

There are basically two types of addressing sequences provided by the address generator circuit: a normal sequence and a modulo-N sequence. There are also two types of sequence terminations: a sequence "with stop" and a sequence "with restore." The sequence "with stop" terminates when a zero count accumulator value is detected upon the execution of a "next" instruction. This sets the zero flag, which causes the selection of a different input for the adder 54. As best illustrated in TABLE 4, when the zero flag is set to a one, a "next" instruction causes the memory address register (MAR) 56 to be loaded with the accumulator register contents, which is left unchanged. In other words the termination "with stop" causes the same address that was last generated, and stored in the accumulator register, to be selected for output.

On the other hand, a sequence "with restore" terminates by selecting for output the same address that resulted from the "first" instruction that started the sequence. As shown in TABLE 4, sequences "with restore" terminate by loading the memory address register with the contents of the base register 32. This effectively starts the address sequence over again.

The modulo-N addressing sequence is useful in a variety of computations. It is used in conjunction with the sign detection signal from the comparator 120, to provide two alternative address displacements in the same computational scheme. A numerical example is the simplest form of explaination of the modulo-N addressing sequence.

Consider a four-by-four matrix of numbers that is stored row-wise in sequential addresses in memory. For example, if the first number is stored at memory address 1001 (in decimal notation), the addresses of the matrix elements will be as follows, where the position of an address indicates the position of the coresponding element in the original matrix:

| 1001 | 1002 | 1003 | 1004 |
|------|------|------|------|
| 1005 | 1006 | 1007 | 1008 |
| 1009 | 1010 | 1011 | 1012 |
| 1013 | 1014 | 1015 | 1016 |

Now suppose that, to satisfy the requirements of a processing procedure, it is desired to access the elements of the matrix in a column-wise fashion. Clearly, the elements of the first column could be accessed by setting a base address at 1001 and a displacement address of four. The second column could be accessed by changing the base to 1002, and so forth. However, an n x n matrix would then need n addressing sequences to access the entire matrix. The circuit of the invention accomplishes the same result with a single addressing sequence.

To initiate the sequence, the displacement register is loaded with the row displacement value, i.e. +4, and the extension register is loaded with the displacement needed to make a transition from the end of one column to the start of the next. This value is −11, since 1013−11=1002, 1014−11=1003, and so forth. A subtraction step is built into the use of the extension register, so the value +11 is initially loaded into the extension register. The first memory address is obtained with a "first" instruction (12) of the appropriate type. If a sequence "with stop" is required, the instruction will have an auto-mode of 1 (see TABLE 3), and a mode flag of zero. The base register is initially loaded with a value of 1012. On execution of the "first" instruction, the memory address register yields an address output of B-E, i.e. 1012−11=1001, the first address of the first matrix column.

The subsequent execution of a "next" instruction (TABLE 4, auto-mode=1) results in the use of the displacement register, since the sign of A-B is negative, which sets the sign flag and selects the displacement register 34 for input to the adder 54. Thus, the output address is computed as A+D, or 1001+4=1005. Similarly, addresses 1009 and 1013 are obtained with subsequent "next" instructions. The accumulator register A now contains the address value 1013 and B is still set at 1012. Thus the sign of A-B becomes positive and the sign flag is complemented. On the ensuing "next" instruction, the extension register is employed instead of the displacement register. The output address is computed as A-E, or 1013−11=1002, the first element in the second column. The value of A is now less than B, so the displacement register is used to compute the sequence of addresses in the second column, until A reaches 1014, at which point the "next" instruction again causes the use of the extension register to advance to the third column. The same transisition occurs at the end of the third column.

At the final displacement of the matrix, between addresses 1012 and 1016, the displacement register continues to be used. The test for comparing the sign of A-B is whether A is less than or equal to B. The test may be modified to one of merely "A is less than B" by selecting a mode flag of zero instead of one.

Another mode of operation of the address generator may be used when a number of similarly structured records are stored in memory, and each record contains data fields of various lengths. The displacement register 34 may be loaded with the size of a record, to provide addresses for successive records by use of an appropriate "next" instruction. To access a particular field within a record, an additional address offset may be supplied through an immediate instruction field (IMM), and added to the record address still held in the accumulator register. In the instruction set, this is instruction code 06. A subsequent "next" instruction would advance the output address to the same field in the next record. Alternatively, another offset address could be supplied to adance the output address to the beginning of the next record.

One further item of note with respect to the instruction set is that the file pointer may be incremented (instruction 04), read (instruction 01), or loaded with a new value (instructions 0C and 1C). In this manner, the circuit may be employed to keep track of several different addressing organizations at the same time, either for the same program or for different programs sharing the central processor.

It will be appreciated that, although the concepts of the invention may be readily understood from the preceeding description and the block diagram of FIG. 2, the details of implementation are logically quite complex. Inclusion of these details in descriptive form in this specification would not facilitate an understanding of the invention. Moreover, someone of ordinary skill in the art of digital circuit design could readily design a circuit for performing the functions that have been described with reference to the block diagrams and the instruction set. However, for completeness, the design details are provided in Appendix A to this specification which is included as part of the file. This appendix includes an organizational block diagram showing the various circuit modules of the entire address generator circuit, detailed logic diagrams and schematics of each circuit module, and corresponding logic equations for each circuit module.

It will be appreciated from the foregoing that the present invention represents a significant advance in the field of address generation techniques for digital computers. In particular, the invention provides memory addresses in an addressing sequence, in response to "first" and "next" commands, after base and displacement addresses have been set up in address generation file registers. The invention also allows for the storing and manipulation of a number of addressing organizations at the same time. Another specific aspect of the invention is that it permits modulo-N addressing in a single addressing sequence. This feature has a variety of computational applications, including the accessing by columns of a matrix that was stored sequentially by rows. It will also be appreciated that, although a specific embodiment of the invention has been descibed in detail for purposes of illustration, various modifications may be made without departing from the spirit and scope of the invention. Accordingly, the invention is not to be limited except as by the appended claims.

We claim:

1. An address generator circuit for generating memory addresses for use in conjunction with a computer system having a central processor and a data memory, said address generator circuit comprising:

a plurality of address generation files, wherein each of the address generation files contains a plurality of registers for storing a plurality of parameters used in an addressing sequence, and wherein one of said registers in each file is an accumulator register for storing which address in said sequence associated with that file was most recently generated by the address generator circuit;

input means, for receiving both address generation parameters, for transmission to the address generation files, and address generation instructions from the central processor;

output means for supplying memory addresses to the central processor;

address generation file pointer means, for selection of a desired one of said address generation files, in response to control signals received from the central processor; and address generator logic operative in response to the address generation instructions received in said input means to generate at said output a memory address calculated as a function of said address generation instructions and the parameters stored in the address generation file selected by said file pointer, wherein the memory address is not calculated as a function of any of the parameter stored in the other address generation files not selected by said file pointer.

2. An address generator circuit as set forth in claim 1, wherein said address generator logic includes;

means responsive to a "first" instruction received from the central processor through said input means, for generating a first memory address of a desired address sequence; and means responsive to a "next" instruction received from the central processor through said input means, for generating a subsequent address in the sequence.

3. An address generator circuit as set forth in claim 1, wherein each of said address generation files includes:

a base register for storing a base memory address;

an accumulator register for storing a current memory address;

a displacement register for storing a memory address displacement between subsequent addresses in a desired address sequence; and a count accumulator register for storing a count of addresses in the desired sequence.

4. An address generator circuit as set forth in claim 3, wherein said address generator logic includes:

an adder circuit having first and second inputs, and an output coupled to said output means and to said accumulator register; and address data selection means for selecting said first adder input from a plurality of data sources that includes said accumulator register and said base register, and for selecting said second adder input from a plurality of data sources that include said displacement register and a selection of integer values corresponding to fixed address increments;

whereby said adder circuit combines said address file registers to provide address outputs in accordance with instructions received from the central processor, and saves the last address generated in said accumulator register.

5. An address generator circuit as set forth in claim 4, wherein said address generator logic further includes:

means responsive to a "first" instruction from the central processor, for selecting a first address in a desired sequence; and means responsive to a "next" instruction from from the central processor, for selecting a subsequent address in the address sequence, by incrementing the contents of said accumulator register, which represents the previously generated address, by an address displacement selected from said displacement register and the plurality of data sources available for said second adder input.

6. An address generator circuit as set forth in claim 5, wherein said address generator logic further includes:

means for adjusting the contents of said count accumulator register upon the generation of each output address; and means for monitoring said count accumulator register to determine when the end of the address sequence has been reached.

7. An address generator circuit as set forth in claim 6, wherein:

each of said address generation files further includes an extension register, which is also available as a selectable data source for said second input to said adder circuit; and said address generator logic further includes means responsive to instructions from the central processor, for selecting said extension register as an alternative to said displacement register, whereby the address increment stored in said extension register may be selectively employed to generate an address sequence having a first address, a second address and subsequent addresses.

8. An address generator circuit as set forth in claim 7, wherein said address generator logic further includes;

means for generating a sign signal indicative of the sign of the difference between the contents of said accumulator register and the contents of said base register; and means responsive to the sign signal, for automatically selecting from said displacement register and said extension register, to effect a modulo-N addressing sequence.

9. An address generator circuit as set forth in claim 8, wherein:

the first address in the sequence is generated in said adder circuit by subtracting said extension register from said base register, which first address is then less than the contents of said base register and is stored in said accumulator register;

the second address in the sequence is generated in said adder circuit by adding said displacement register to said accumulator register; and each subsequent address in the sequence is generated in the same way as the second address, until said accumulator register exceeds said base register, which causes the selection of said extension register for subtraction from said accumulator register.

10. An address generator circuit as set forth in claim 8, wherein each of said address generation files further includes:

a count restore register, for storing an address count supplied from the central processor, for later use in restoring the contents of said count accumulator register at the end of an address sequence.

11. An address generator circuit as set forth in claim 10, wherein each of said address generation files further includes;

an auto-mode register for designating a desired automatic addressing.

12. An address generator circuit as set forth in claim 11, wherein each of said address generation files further includes:

a flag register for storage of status flags relating to the address sequence.

13. An address generator circuit as set forth in claim 12, wherein:

said output means includes a file data register for output of data from said address generation file register and said address generator logic further includes register selection means, for selecting from said address generation file registers for output through said file data register.

14. An address generator circuit for use in conjunction with a computer system having a central processor and a data memory, said address generator circuit comprising:

a plurality of address generation files, each of which is selectably related to a different address generation sequence, each of said address generation files including an accumulator register, a base register, a displacement register, an extension register and a count accumulator register;

input means, for receiving both address generation file data and address generation instructions from the central processor, and connected to supply input data to the address generation files;

output means for supplying memory addresses to the central processor;

address generation file pointer means, responsive to control signals from the central processor, for selection of a desired one of said address generation files; and address generator logic operative in response to instructions received in said input means, to generator memory addresses at said output means, said generator logic including an adder circuit having first and second inputs and an output coupled to said output means and to the input of said accumulator register, and data selection means for selecting said first adder input from data sources that include said accumulator register and said base register, and for selecting said second adder input from data sources that include said displacement register and said extension register, and a selection of integer values corresponding to fixed address increments.

15. An address generator circuit as set forth in claim 14, wherein each of said address generation files further includes:

a count restore register, for storing an address count supplied from the central processor, for later use in restoring the value in said count accumulator register at the end of address sequence.

16. An address generator circuit as set forth in claim 14, wherein said address generator logic further includes:

means responsive to a "first" instruction from the central processor, for selecting a first address in a desired address sequence; and means responsive to a "next" instruction from the central processor, for selecting a second and each subsequent address in the address sequence by incrementing the contents of said accumulator register, which represents the previously generated address, by an address displacement selected from said displacement register, said extension register and the other data sources available for said second adder input.

17. An address generator circuit as set forth in claim 16, wherein said address generator logic further includes:

means for adjusting the contents of said count accumulator register upon the generation of each output address; and means for monitoring said count accumulator register to determine when the end of the address sequence has been reached.

18. An address generator circuit as set forth in claim 17, wherein said address generator logic further includes:

means for generator a sign signal indicative of the sign of the difference between the contents of said accumulator register and the contents of said base register; and means responsive to the sign signal, for automatically selecting from said displacement register and said extension register, to effect a modulo-N addressing sequence.

19. An address generator circuit as set forth in claim 18, wherein:

the first address in the sequence is generated in said adder circuit by subtracting said extension register from said base register, which first address is then less than the contents of said base register and is stored in said accumulator register;

the second address in the sequence is generated in said adder circuit by adding said displacement register to said accumulator register; and each subsequent address in the sequence is generated in the same way as the second address, until said accumulator register exceeds said base register, which causes the selection of said extension register for subtraction from said accumulator register.

20. An address generator circuit as set forth in claim 14, wherein each of said address generation files further includes:

an auto-mode register for designating a desired automatic addressing mode.

21. An address generator circuit as set forth in claim 20, wherein each of said address generation files further includes:

a flag register for storage of status flags relating to the address sequence.

22. An address generator circuit as set forth in claim 21, wherein:

said output means includes a file data register for output of data from said address generation file registers; and said address generator logic further includes register selection means, for selecting from said address generation file registers for output through said file data register.

23. An address generator circuit for generating memory addresses for use with a data processing system having an addressable data memory, comprising:

a plurality of address generation files, each of which includes one or more parameter registers for storing one or more parameters which define a sequence of memory addresses, whereby each address generation file defines a corresponding sequence of memory addresses;

pointer means for selecting a desired one of the address generation files; and address generator logic means, responsive to a "next" instruction signal, for outputting a memory address whose value is the next address in the sequence of addresses defined by the file currently selected by the pointer;

wherein each address generator file further includes an accumulator register for storing which one of the addresses in the sequence of addresses defined by the file was most recently outputted by the logic means; and wherein, each time the logic means receives a "next" instruction, the logic means calculates the memory address to be outputted as a function of the values stored in the accumulator register and the parameter registers of the address generation file currently selected by the pointer, and then the logic means stores the outputted memory address in that accumulator register in place of the address previously stored in that accumulator register;

whereby the address generator circuit is capable of alternating among a plurality of different address sequences in such a way that a given sequence may be interrupted in order to output addresses in one or more other sequences, and then the first sequence may be continued from the point of interruption without being re-initialized.

* * * * *